(12) United States Patent
Lee

(10) Patent No.: US 6,654,349 B1
(45) Date of Patent: Nov. 25, 2003

(54) REAL TIME AUTOMATED CHECKING MECHANISM FOR A BUS PROTOCOL ON AN INTEGRATED BUS SYSTEM

(75) Inventor: Weng Fook Lee, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/375,329

(22) Filed: Aug. 17, 1999

(51) Int. Cl.[7] .............................................. G01R 31/08
(52) U.S. Cl. ........................ 370/252; 710/100; 370/241
(58) Field of Search ................................. 370/252, 241, 370/242, 244, 247, 254, 465, 466, 400, 467, 402; 710/129, 1, 100, 65; 706/2, 15

(56) References Cited

U.S. PATENT DOCUMENTS

| | | | | |
|---|---|---|---|---|
| 5,870,399 A | * | 2/1999 | Smith | 370/465 |
| 5,991,841 A | * | 11/1999 | Gafken | 710/104 |
| 6,119,189 A | * | 9/2000 | Gafken | 710/110 |
| 6,131,127 A | * | 10/2000 | Gafken | 710/1 |
| 6,170,027 B1 | * | 1/2001 | Lu | 710/65 |
| 6,393,587 B2 | * | 5/2002 | Bucher | 714/39 |

* cited by examiner

Primary Examiner—Douglas Olms
Assistant Examiner—Ricardo M. Pizarro
(74) Attorney, Agent, or Firm—Foley & Lardner

(57) ABSTRACT

A bus protocol is checked automatically during design or manufacture by connecting a bus protocol monitor to the bus and monitoring signals applied to the bus. The response to those signals is then compared with a predetermined desired response. A signal is generated to alert the protocol designer or manufacturing controller if there is an improper response that indicates that the protocol is in error. The invention is particularly useful as applied to check an LPC bus protocol.

19 Claims, 1 Drawing Sheet

REAL TIME AUTOMATED CHECKING MECHANISM FOR A BUS PROTOCOL ON AN INTEGRATED BUS SYSTEM

BACKGROUND OF THE INVENTION

This invention relates to bus protocols. In particular, it is a method of and an apparatus for performing a check on an LPC (low pin count) bus protocol that is in the process of design or manufacture, but it can be used with other bus protocols.

A part of the design of a semiconductor chip is ensuring that a bus protocol is performing properly. This normally involves manually checking the protocol by following a sequence of steps to compare actual performance of the protocol with the desired performance. This is a time-consuming process that has many chances for errors. It would be helpful to have a way to check the protocol automatically. Such a process would also be of value in checking to see that production chips had properly functioning protocols.

SUMMARY OF THE INVENTION

A bus protocol is checked automatically during design or manufacture by monitoring signals applied to a bus and comparing the response to those signals with a predetermined desired response. A signal is generated to alert the protocol designer or manufacturing controller if there is an improper response that indicates that the protocol is in error. The invention is particularly useful as applied to check an LPC bus protocol.

DETAILED DESCRIPTION OF THE INVENTION

Figure 1:
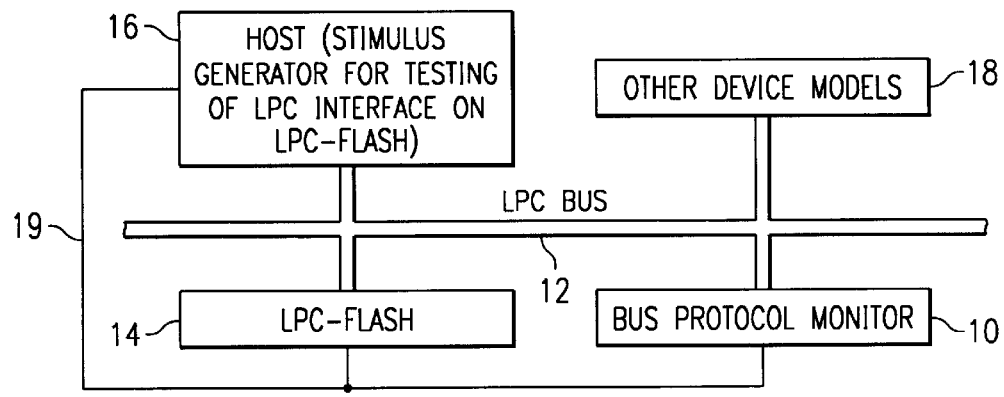
FIG. 1 is a block diagram of the operation of the bus protocol monitor of the present invention.

FIG. 1 is a block diagram of the operation of the bus protocol monitor of the present invention. In FIG. 1, a bus protocol monitor 10 is connected to an LPC bus 12. The bus protocol monitor 10 may be a computer for control. The LPC bus 12 carries signals associated with a low-pin-count protocol. This is a standard protocol used as a design aid to minimize pin count in a design. An LPC-flash device 14 is also connected to the bus 12 as the protocol to be checked. A host 16 is connected to the bus 12 as a stimulus generator to provide signals to test the LPC flash device 14. The LPC bus 12 is used here as exposing the protocol to be tested, but other protocols could be tested as with the other device 18 that is also 15 connected to the bus 12. A line 19 may connect the bus protocol monitor 10, the LPC-flash device 14, and the host 16 to supply a TEST# signal to begin the protocol test.

Figure 2:
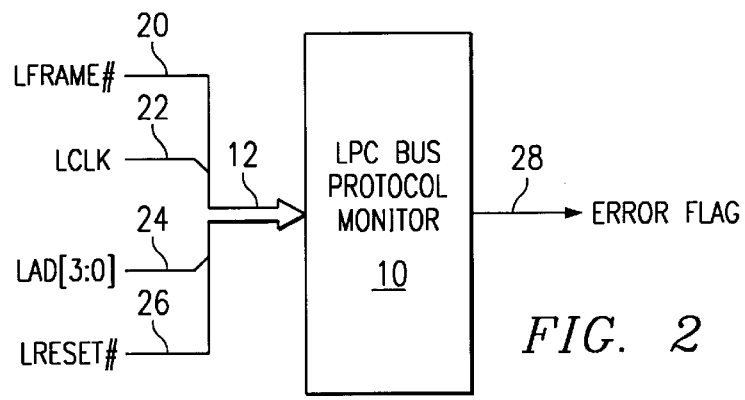
FIG. 2 is a state diagram of the operation of the bus protocol monitor of the present invention.

FIG. 2 is a block interface diagram of the operation of the present invention. In FIG. 2, the bus protocol monitor 10 of FIG. 1 is shown as receiving several signals from the bus 12 of FIG. 1. These signals are LFRAME#20, LCLK 22, LAD 24, and LRESET#26. These signals are compared in bus protocol monitor 10 with the expected signals and an error flag 28 is generated if the signals do not compare.

Figure 3:
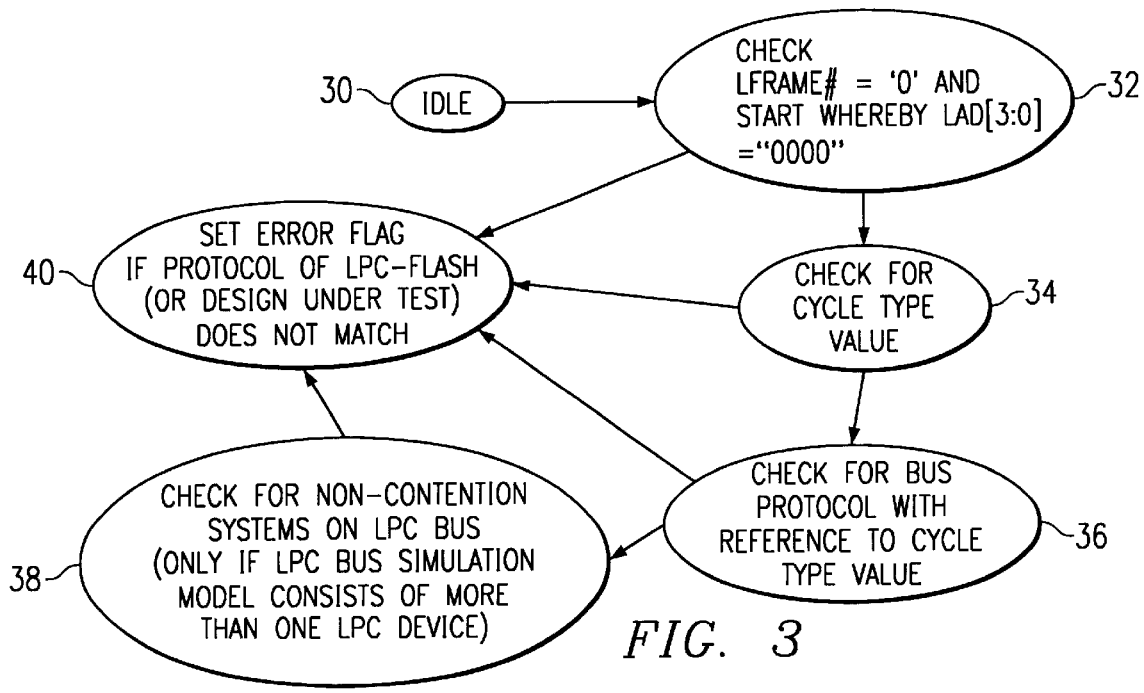
FIG. 3 is a symbolic view of the inputs to and the output of the bus protocol monitor of the present invention.

FIG. 3 is a state diagram of the inputs to and the output of the Bus Protocol Monitor of the present invention. In FIG. 3, an idle state 30 is on the bus 10 of FIG. 1 before testing starts. A check block 32 begins the test of the protocol by checking for the signal LFRAMEB to be equal to zero and START-state which consists of LAD[3.0]="0000.". A check block 34 next checks for the cycle type value. A check block 36 then checks for the desired bus protocol with reference to the cycle type value from the check block 34. A check block 38 then checks to see if two or more systems are in contention if more than one device of the type being tested is on the bus 10 at the same time. Signals are taken from the check blocks 32, 34, 36, and 38 to a block 40 that sets an error flag if any of the check blocks 32, 34, 36, or 38 detects a discrepancy in the protocol being tested. The error flag can be programmed to identify the location and type of the error.

The automated test of the protocol that is provided by the present invention increases the effectiveness of a protocol designer by producing instant results when there is an error or inconsistency in a protocol being tested. The test also can be applied in the production of chips to be sure that the protocol programmed into the chip is functioning as the designer planned it to.

The disclosure of the invention provided above is intended to be illustrative and not limiting. The scope of the invention should be limited only by the claims and their equivalents.

I claim:

1. An apparatus for testing an LPC protocol through responses to signals on a bus, the apparatus comprising:
   a) a stimulus generator connected to the bus to apply the signals to the bus;
   b) a bus protocol monitor connected to the bus to detect automatically a response to the signals on the bus from a semiconductor device and to compare the detected response with a predetermined response; and
   c) a flag signal generator to generate a flag when the bus protocol monitor detects a difference in the detected response and the predetermined response, wherein the flag signal generator generates a flag that identifies where the difference in the detected response and the predetermined response is located wherein the bus is an LPC bus.

2. An apparatus for testing an LPC bus protocol through responses to signals on a bus, the apparatus comprising:
   a) a stimulus generator connected to the LPC bus to apply the signals to the bus;
   b) an LPC bus protocol monitor connected to the LPC bus to detect automatically a response to the signals on the LPC bus from a semiconductor device and to compare the detected response with a predetermined response; and
   c) a flag signal generator to generate a flag when the LPC bus protocol monitor detects a difference in the detected response and the predetermined response, wherein the flag signal generator generates the flag to identify where the difference in the detected response and the predetermined response is located wherein the bus is a LPC bus.

3. An apparatus for testing an LPC bus protocol through responses to signals on a bus, the apparatus comprising:
   a) a stimulus generator connected to the LPC bus to apply the signals to the bus;
   b) an LPC bus protocol monitor connected to the LPC bus to detect automatically a response to the signals on the LPC bus and to compare the detected response with a predetermined response; and c) a flag signal generator to generate a flag when the LPC bus protocol monitor detects a difference in the detected response and the predetermined response, wherein the flag signal generator generates the flag to identify where the difference in the detected response and the predetermined response is locate, wherein the LPC bus protocol monitor operates according to a state machine, wherein the state machine includes an error state at which the error flag is generated, wherein the error state is reached if any of a plurality of check blocks detects a discrepancy in the protocol.

4. A method for testing a protocol on a bus comprising the steps of:
   a) applying a predetermined test signal to the bus;
   b) detecting a response to the predetermined test signal;
   c) comparing the response to the predetermined test signal with a predetermined comparison signal; and
   d) generating an error flag if the response to the predetermined test signal is different from the predetermined comparison signal, wherein the step of generating an error flag comprises in addition the step of identifying where the difference in the detected response and the predetermined response is located wherein the bus protocol monitor includes a state machine comprised of an error state and a plurality of check states wherein the protocol is tested by a bus protocol monitor wherein the check states include a cycle type value check, an L FRAME B equal to zero check, and a bus contention check.

5. The apparatus of claim 2, wherein the LPC bus is coupled to a semiconductor device.

6. The apparatus of claim 1, wherein the semiconductor device is a flash cell.

7. The method of claim 4, wherein the error flag identifies where the difference in the detected response is located.

8. The method of claim 4, wherein the step of generating an error flag occurs on an LPC bus.

9. The method of claim 4, wherein the bus is an LPC bus.

10. The apparatus of claim 5, wherein the semiconductor device is an LPC flash device.

11. The apparatus of claim 2, wherein the LPC bus protocol monitor utilizes an L FRAME B signal.

12. The apparatus of claim 3, wherein one of the check blocks determines if a signal L FRAME B is equal to zero and a START-state consists of LAD equal to 0000.

13. The apparatus of claim 3, wherein one of the check blocks checks for a desired protocol with reference with a cycle type value.

14. The apparatus of claim 12, wherein one of the check blocks determines if two or more systems are in contention for more than one device on the LPC bus.

15. The method of claim 8 wherein a flash memory device is coupled to the bus.

16. The method of claim 8, wherein the protocol is tested by a bus protocol monitor utilizing an LPC protocol.

17. The method of claim 16, wherein the bus protocol monitor is disposed on a flash memory device.

18. The method of claim 8, wherein a flash memory device is couple to the bus.

19. The apparatus of claim 1, wherein the bus includes conductors for an L FRAME signal, an LCLK, an LAD signal, and an LRESET signal.

* * * * *

UNITED STATES PATENT AND TRADEMARK OFFICE
CERTIFICATE OF CORRECTION

PATENT NO. : 6,654,349 B1
DATED : November 25, 2003
INVENTOR(S) : Weng Fook Lee

It is certified that error appears in the above-identified patent and that said Letters Patent is hereby corrected as shown below:

Column 2,
Line 60, replace the word "a" with the word -- an --.

Column 3,
Line 8, replace the word "locate" with the word -- located --.

Column 4,
Line 29, replace the word "couple" with the word -- coupled --.

Signed and Sealed this

Twenty-seventh Day of July, 2004

JON W. DUDAS
*Acting Director of the United States Patent and Trademark Office*